(12) United States Patent
Scott

(10) Patent No.: US 6,836,189 B2
(45) Date of Patent: Dec. 28, 2004

(54) RF CHOKE BIAS SCHEME FOR LOAD PULLED OSCILLATORS

(76) Inventor: Bentley N. Scott, 3206 Bridle Path Ct., Garland, TX (US) 75044

(*) Notice: Subject to any disclaimer, the term of this patent is extended or adjusted under 35 U.S.C. 154(b) by 0 days.

(21) Appl. No.: 10/062,398

(22) Filed: Jan. 31, 2002

(65) Prior Publication Data

US 2002/0125962 A1 Sep. 12, 2002

Related U.S. Application Data

(60) Provisional application No. 60/265,365, filed on Jan. 31, 2001.

(51) Int. Cl.[7] .................................................. H03B 5/00
(52) U.S. Cl. ......................... 331/117 FE; 331/117 R; 331/117 V; 331/167; 331/74; 331/175; 324/639
(58) Field of Search ...................... 331/117 FE, 117 R, 331/167, 175, 74, 177 V, 116 R; 324/639

(56) References Cited

U.S. PATENT DOCUMENTS 5,712,596 A * 1/1998 Van Amesfoort ............ 331/76
6,323,739 B1 * 11/2001 Andrews ................. 331/117 R

* cited by examiner

Primary Examiner—Arnold Kinkead
(74) Attorney, Agent, or Firm—Groover & Holmes

(57) ABSTRACT

A load-pulled oscillator circuit in which RF blocking on the power supply connections is achieved by an active stage rather than an inductor. This avoids the problems of temperature dependence, low-frequency oscillation, and backward tuning which can occur when using an inductor in a load-pulled oscillator.

17 Claims, 4 Drawing Sheets

RF CHOKE BIAS SCHEME FOR LOAD PULLED OSCILLATORS

CROSS-REFERENCE TO OTHER APPLICATION

This application claims priority from Ser. No. 60/265,365, filed Jan. 31, 2001, which is hereby incorporated by reference.

BACKGROUND AND SUMMARY OF THE INVENTION

The present invention relates to load-pulled oscillator circuits and systems.

Background: Biasing Circuits

DC Biasing circuits for oscillators typically incorporate radio frequency (RF) chokes (i.e. high inductance rf blocking inductors), with a shunt capacitance to ground immediately after the choke. This provides a high impedance to the RF while providing a DC path for the biasing of the active devices. (Providing a high RF impedance helps to avoid unwanted RF circuit paths which can cause unwanted oscillation modes, and also avoids damping of the RF oscillation.)

This conventional method encounters some difficulties in broadband RF circuits. At microwave frequencies almost any real-world passive device with have substantial reactance from series inductances and shunt capacitances, so that self-resonances can occur. For circuits which operate only over a limited frequency range this can usually be avoided by appropriate component selection, but for circuits which operate over a frequency range of an octave or more (i.e. whose highest required operating frequency is double the lowest) these resonances can be a problem. Even if the choke does not hit resonance as a single lumped element, partial resonances within the windings or leads can still cause frequency-dependent impedance changes, and this may cause the RF choke to be less than adequate isolation at some frequencies. Also, inductance-generated voltage spikes are detrimental to circuit and device performance.

One way to keep the choke's impedance high over a range of frequencies would be to load the choke with ferrites or other magnetic materials. However, such materials typically have a large temperature coefficient, which can cause undesirable frequency shifts in oscillators. Even small lead or inter-winding resonances can affect the tuning characteristics of oscillators, causing power dips and (worse yet) backwards tuning (where frequency is NOT monotonically dependent on tuning voltage in a varactor tuned oscillator).

Background: Load-Pulled Oscillators

Load-pulled oscillators are an important technique for RF monitoring. A free-running oscillator, typically at VHF or higher frequencies, is electromagnetically coupled to some environment which is desired to be characterized. (For example, an unknown oil/water/gas composition can be flowed through a coaxial probe section.) Since the oscillator is not isolated from the environment being measured, changes in that environment will pull the frequency of oscillation. By monitoring shifts in the frequency of oscillation, changes in the environment being monitored can be seen with great precision. (For example, in compositional monitoring of wellhead flows of oil/gas/water mixtures, the environment being monitored is a medium having a variable composition, and changes in the composition are seen as shifts in the oscillation frequency for a given tuning voltage.) Such circuits are described e.g. in published PCT application WO 91/08469 (published 13 Jun. 1991), which is hereby incorporated by reference.

The load pulled oscillator requires a topology which will support oscillations throughout a change in the load impedance from the capacitive to inductive loading. Typically such an oscillator must cover octave or more bandwidths and remain capable of oscillating into any load impedance or phase within its range.

In order to design a system to be capable of this range, biasing and impedance effects of the associated DC networks must be considered from an RF or microwave perspective. DC biasing achieved from the use of RF chokes and resistors is effective only if the chokes are effectively an open with no resonances, and if the combinations of inductance, resistance and capacitance don't limit the ability of the circuit to respond broad band.

Use of standard commercial grade inductors as RF chokes in the frequency range of 100 MHz to 1 GHz was accomplished by use of 100 nH to 2200 microH inductors of the coil variety. The problems were that for high frequency oscillators, the lower inductance allowed undesired low frequency oscillations to occur at certain loads and frequencies. The larger inductors supplied excellent blocking, but created problems at the second harmonic of the frequency, thus causing backward tuning and decrease in load pull sensitivities. These same problems can be even worse at higher microwave frequencies. These problems relate to self-resonance characteristics of the RF choke.

The need for broadband chokes in load pulled oscillators is particularly severe, since any change in frequency or impact on the oscillator performance limits the ability to resolve microwave parameters. Ideally, when such systems are used for measurement of material parameters, the oscillator frequency will respond very precisely to changes in the load impedance; but when components of the circuit are also changing their impedance as the oscillator frequency shifts, the relation between oscillator frequency and load impedance becomes less direct.

Improved RF Choke Bias Scheme for Load Pulled Oscillators

Load-pulled oscillators differ fundamentally from other RF circuits, in that the load-pulled oscillator is NOT required to be insensitive to variations in the circuit stages which follow it: the whole purpose of the load-pulled oscillator circuit is to respond to changes in load impedance, so isolation and similar techniques are not applicable. The present inventor has realized that in load-pulled-oscillators, unlike other RF oscillators, temperature dependence and impedance changes in the blocking chokes are important problems. The present application therefore teaches a new way to solve this problem: the innovative circuits combine a load-pulled oscillator with a blocking stage which uses a self-biased active device to emulate an RF choke.

The use of an active choke-emulating stage provides dynamic control of performance while creating an open circuit without parasitic resonances.

The disclosed innovations, in various embodiments, provide one or more of at least the following advantages:
monotonic tuning;
reduced temperature dependence;
reduced risk of unwanted frequency hop; and
reduced risk of spectral breakup.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
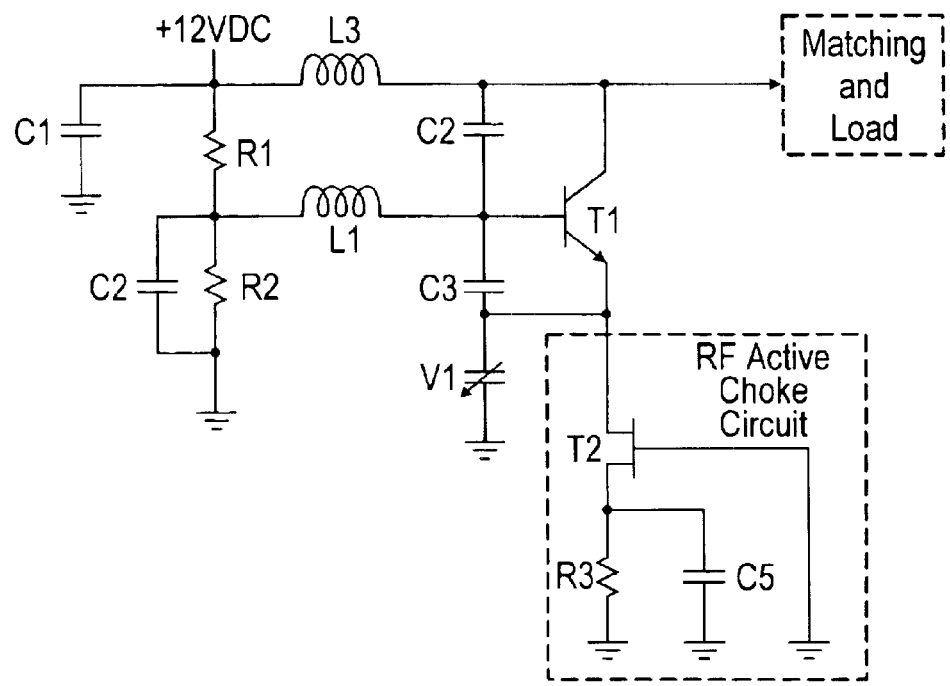
FIG. 1 shows a sample embodiment of a load-pulled oscillator with an inductorless active choke stage.

The numerous innovative teachings of the present application will be described with particular reference to the presently preferred embodiment (by way of example, and not of limitation).

In order to design a load-pulled system with superior performance, biasing and impedance effects of the associated DC networks must be considered from an RF or microwave perspective. DC biasing achieved from the use of RF chokes and resistors is effective only if the chokes are an open circuit with no resonances, and if the combinations of inductance, resistance and capacitance do not limit the ability of the circuit to respond broad band (i.e. across a frequency range of more than an octave).

Use of standard commercial grade inductors as RF chokes in the frequency range of 100 MHz to 1 GHz was accomplished by use of surface-mounted 100 nH to 2200 $\mu$H inductors of the coil variety. The problems were that for high frequency oscillators, the lower inductance resulted in low power, poor isolation from DC circuit parasitics, and undesirable low frequency oscillations at certain loads and frequencies. The larger inductors supplied excellent blocking, but created problems at the second harmonic of the frequency, thus causing backward tuning and decrease in load pull sensitivities (corresponding to self-resonances or to ferrite dependence on temperature). These same problems become worse as frequencies range higher into the microwave region.

The present application teaches the use of a self biased active device (e.g. a junction FET) in the emitter circuit instead of the usual RF choke and bias resistor. This provides a dynamic current control due to the action of the resistor in the source of the FET. This resistor maintains a voltage from gate to source which will regulate the current dynamically. This coupled with the biased FET's high impedance will provide an excellent RF choke without the impact of parasitic resonances. The physical path is shorter and therefore the electrical length is reduced from inductor type of chokes. Additionally, the dynamic action of the FET coupled with the reduction in inductance will reduce the voltages seen at the emitter and therefore, will clean up spurious performance which is generated by large voltage swings causing BE avalanche and therefore generating harmonics. An additional capacitor across the source resistor can be implemented which will provide DC stability and prevent RF dynamic biasing if for some reason this is required.

The use of an active device to control the current in the load pulled oscillator circuit provides a dynamic control of the performance while creating an open circuit without parasitic resonances.

When a bipolar transistor is used as the oscillator's active device, the effect of the base voltage set by the DC bias also sets the emitter voltage (a "diode drop" higher, i.e. about 0.6V.) The FET's flat F/V curves help to maintain the DC bias at a constant current and voltage at the connection between the drain of the JFET and the emitter of the bipolar. This is the definition of a dynamic open circuit, i.e. delta V over delta I is constant (if the FET responds as quickly as the gain device), so that an open circuit load line results.

FIG. 1 shows a sample embodiment of a load-pulled oscillator with an inductorless active choke stage. The DC supply to the emitter terminal of the gain device T1 is provided by the active choke circuit which includes R3, CS, and JFET T2.

Figure 2:
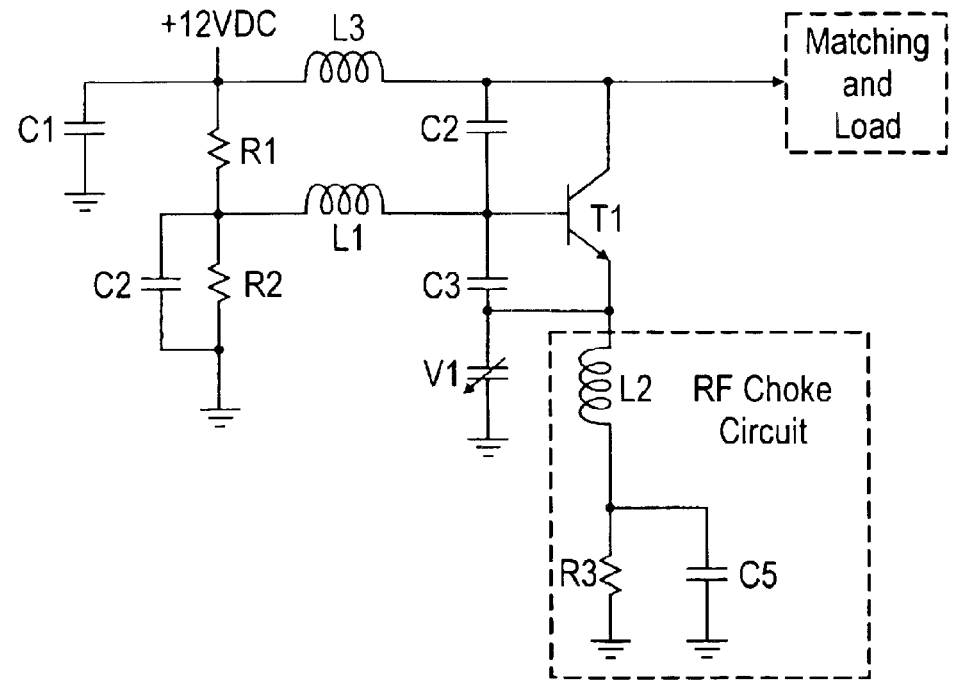
FIG. 2 shows a conventional load-pulled oscillator with a conventional choke inductor.

FIG. 2 shows a conventional load-pulled oscillator with a conventional choke inductor. Note that in this case the RF Choke Circuit merely includes an inductor L2, with resistor R3 and capacitor C4.

Figure 3:
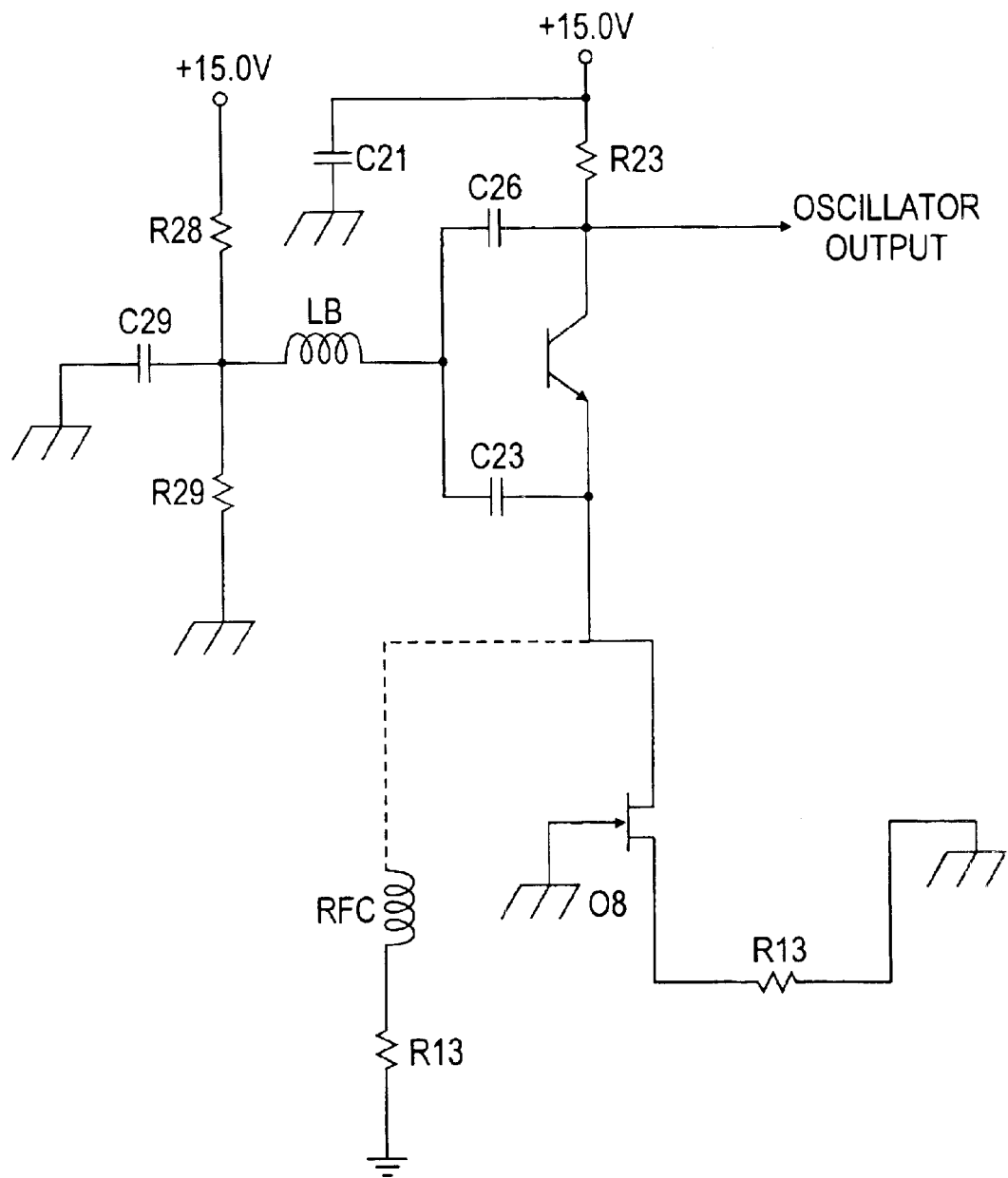
FIG. 3 shows a more detailed realization of a load-pulled oscillator with an inductorless active choke stage.

FIG. 3 shows a more detailed realization of a load-pulled oscillator with an inductorless active choke stage. The conventional configuration of FIG. 2 is shown merely as an alternative, with dashed connections. Note also that capacitors C4 and C5 are not used, although some parasitic capacitance is likely to be present. JFET Q8 provides an active choke stage.

Figure 4A:
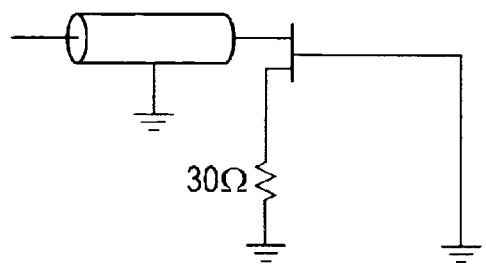
FIGS. 4A and 4B are Smith charts showing the variation of complex impedance with frequency of the inductorless active choke stage of FIG. 3.
Figure 4A:
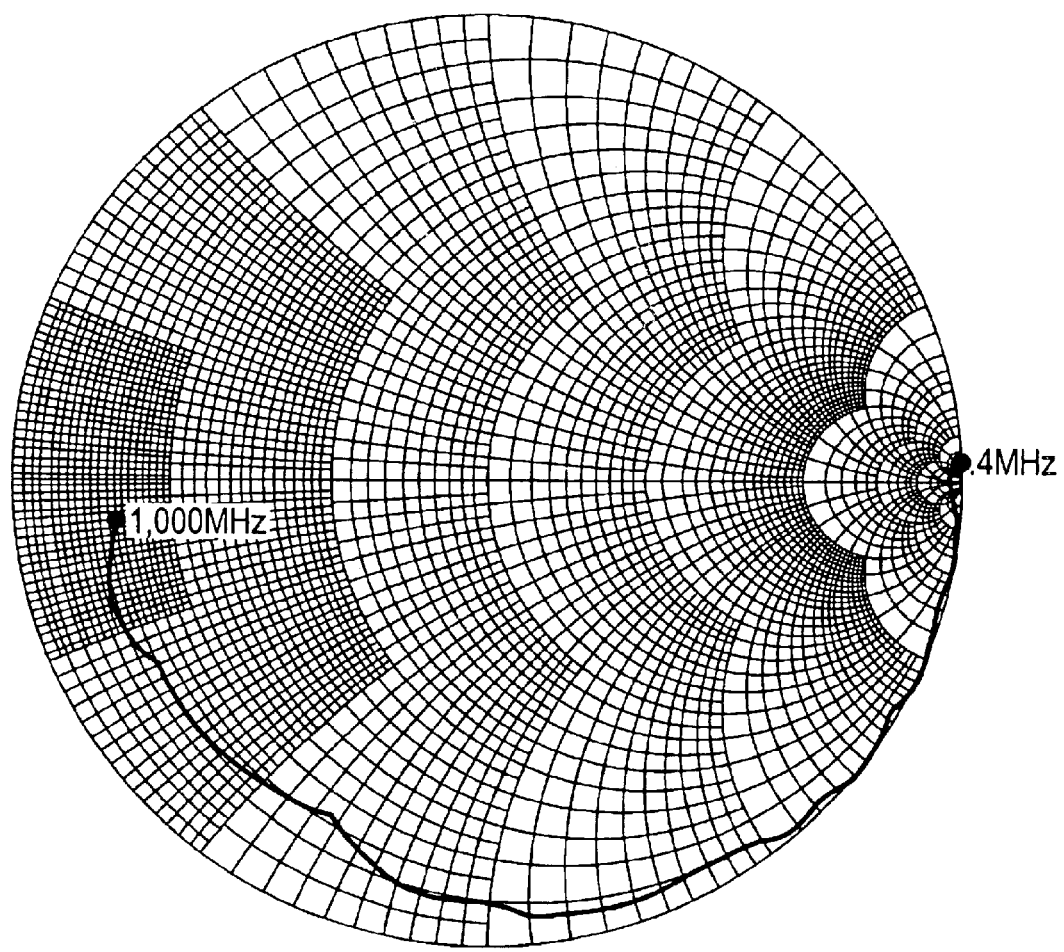
Figure 4B:
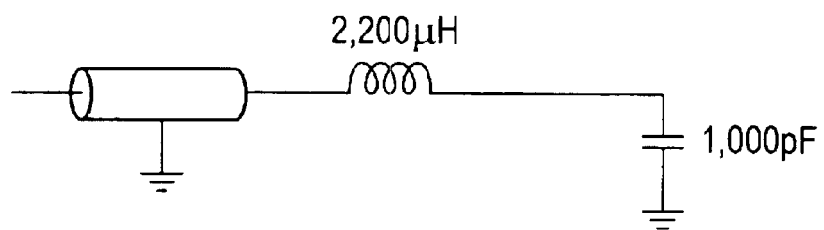
Figure 4B:
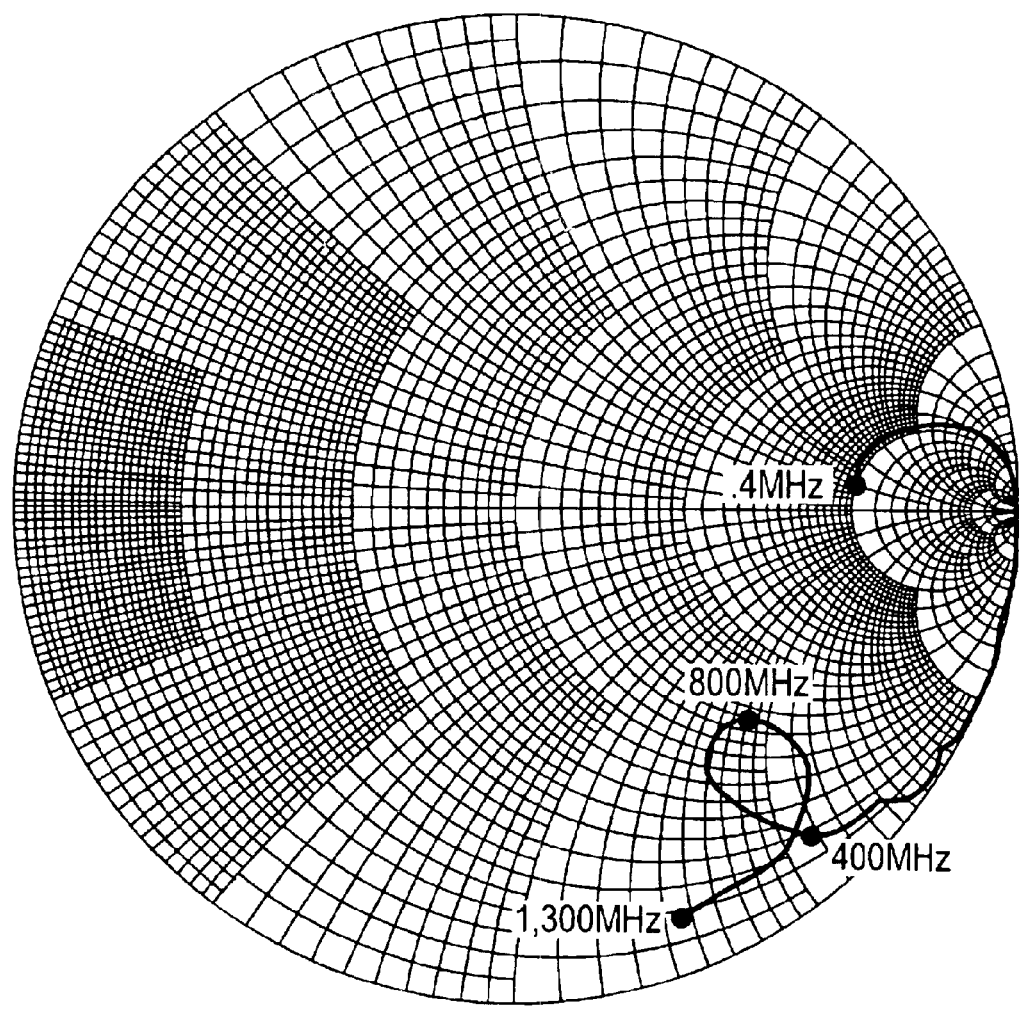

FIG. 4B is a Smith charts showing the variation of complex impedance of the alternative version of FIG. 3, using the conventional inductor RFC (shown with the dashed connections) and NOT the JFET bias element Q8. Note that a loop is observed going from 400 MHz through 800 to 1300 MHz. This indicates the occurrence of a self resonance at about 800 MHz, and produces an undesirably low impedance at that frequency.

FIG. 4A is a Smith chart showing the variation of complex impedance with frequency of the inductorless active choke stage of FIG. 3. Note that the magnitude of impedance is much more constant than in FIG. 4B.

According to a disclosed class of innovative embodiments, there is provided: A load-pulled oscillator circuit, comprising: an RF gain stage, comprising at least a first active device; an RF-blocking stage, interposed between said gain stage and at least one power supply voltage, and incorporating a second active device which is connected to at least partially emulate an RF choke.

According to another disclosed class of innovative embodiments, there is provided: A load-pulled oscillator circuit, comprising: an RF gain stage, comprising at least a first active device; an RF-blocking stage, interposed between said gain stage and at least one power supply voltage, and incorporating a second active device which is connected to at least partially emulate an RF choke; wherein said second active device has a frequency bandwidth which is equal to or greater than said first device.

According to another disclosed class of innovative embodiments, there is provided: A system, comprising: a load-pulled oscillator circuit which includes an RF gain stage comprising at least a first active device, and an RF-blocking stage, interposed between said gain stage and at least one power supply voltage, and incorporating a second active device which is connected to at least partially emulate an RF choke; a probe which is connected to said output terminal, and which is electromagnetically coupled to a measurement environment of interest; and a monitoring circuit which observes frequency shifts of said oscillator circuit.

According to another disclosed class of innovative embodiments, there is provided: A method of operating a load-pulled oscillator, comprising the steps of: allowing a gain stage, which comprises at least a first active device, to oscillate while being pulled by reactance seen at a load connection; and emulating an RF choke, to provide an RF-isolated supply voltage to said gain stage, using a second active device.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

The active device in the blocking stage does not strictly have to be a JFET, but can optionally be implemented with a variety of device technologies, as long as the device is fast enough to track the frequency of the gain stage. (Surprisingly, a device in the blocking stage which does not have adequate bandwidth will typically produce increased harmonics at its output; this is because the gain stage's waveform is not being tracked accurately.)

For example, in one class of embodiments the active blocking stage is implemented by a MESFET.

For another example, in one class of embodiments the active blocking stage is implemented by a MOSFET. Self-biasing can be provided, for example, by tying gate to drain, as in a depletion-load configuration.

For another example, in one class of embodiments the active blocking stage is implemented by a HEMT.

Optionally the disclosed circuit innovations can be used in implementations which include more than one active blocking stage.

Optionally the disclosed circuit innovations can also be used with load-pulled oscillators which include more than one gain stage.

Optionally the disclosed circuit innovations can also be used with a variety of gain stage topologies other than that shown, which can include discrete, integrated, and/or parasitic feedback elements.

Optionally the disclosed circuit innovations can also be used with oscillators which combine one or more load-pulled stages with one or more other stages.

Optionally the disclosed circuit innovations can also be used with load-pulled oscillators in which a self-biased active blocking stage is combined with a small (and preferably air-coil) inductor.

Optionally the disclosed circuit innovations can also be used with a load-pulled oscillator in which an active blocking stage is implemented using a fast active device which amplifies the apparent inductance of a small inductor (preferably an inductor which is loaded by a damping material which preferentially suppresses harmonics).

For example, in one class of contemplated embodiments the innovative choke emulation can be used on the collector side of the gain device.

In another sample one class of contemplated embodiments the innovative choke emulation can be used in the varactor tuning voltage connection. (In this case the range of tuning voltages would have to be restricted, if the circuit implementation is like that of FIG. 3, to voltages above a certain minimum value, e.g. 5V or so.)

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A system, comprising:

a load-pulled oscillator circuit which includes an RE gain stage comprising at least a first active device, and an RF-blocking stage, interposed between said gain stage and at least one power supply voltage, and incorporating a second active device which is connected to at least partially emulate an RE choke, a probe which is connected to an output terminal of said gain stage, and which is electromagnetically coupled to a measurement environment of interest; and a monitoring circuit which observes frequency shifts of said oscillator circuit.

2. The system of claim 1, comprising a connection which provides a tuning voltage to a voltage-controlled reactance which is coupled to said gain stage.

3. A method of operating a load-pulled oscillator, comprising the steps of:

(a.) allowing a gain stage, which comprises at least a first active device, to oscillate while being pulled by reactance seen at a load connection; and (b.) emulating an RE choke, to provide an RF-isolated supply voltage to said gain stage, using a second active device which has a current carrying terminal connected to at least partially emulate an RF choke.

4. The method of claim 3, wherein said emulating step does not use any inductor.

5. The circuit of claim 1, wherein said RF-blocking stage does not use any inductor.

6. A load-pulled oscillator circuit, comprising:

a free-running RF gain stage, comprising at least a first active device;

an RF-blocking stage, interposed between said gain stage and at least one power supply voltage, and incorporating a second active device which has a current carrying terminal connected to at least partially emulate an RF choke.

7. The circuit of claim 6, wherein said gain stage comprises only a single active device.

8. The circuit of claim 6, wherein said gain stage also comprises one or more reactive elements connected to a control terminal and to another terminal of said first active device.

9. The circuit of claim 6, wherein said gain stage also comprises a voltage-controlled tuning varactor.

10. The circuit of claim 6, further comprising an output terminal at which a load is connected to said gain stage without any isolation.

11. The circuit of claim 6, wherein said RF-blocking stage does not use any inductor.

12. A load-pulled oscillator circuit, comprising:

an free-running RF gain stage, comprising at least a first active device;

an RE-blocking stage, interposed between said gain stage and at least one power supply voltage, and incorporating a second active device which has a current carrying terminal connected to at least partially emulate an RF choke;

wherein said second active device has a frequency bandwidth which is equal to or greater than said first device.

13. The circuit of claim 12, wherein said gain stage comprises only a single active device.

14. The circuit of claim 12, wherein said gain stage also comprises one or more reactive elements connected to a control terminal and to another terminal of said first active device.

15. The circuit of claim 12, wherein said gain stage also comprises a voltage-controlled tuning varactor.

16. The circuit of claim 12, further comprising an output terminal at which a load is connected to said gain stage without any isolation.

17. The circuit of claim 12, wherein said RF-blocking stage does not use any inductor.

* * * * *